(12) United States Patent
Yoo

(10) Patent No.: US 10,916,528 B1
(45) Date of Patent: Feb. 9, 2021

(54) COLLAPSIBLE LIGHTING DEVICE HAVING CIRCUIT WIRE AND LED MODULE AND METHOD FOR MANUFACTURING THE SAME

(71) Applicant: HYUNDAI FOMEX CO., LTD., Seoul (KR)

(72) Inventor: Jae Kyun Yoo, Seoul (KR)

(73) Assignee: HYUNDAI FOMEX CO., LTD., Seoul (KR)

( * ) Notice: Subject to any disclaimer, the term of this patent is extended or adjusted under 35 U.S.C. 154(b) by 268 days.

(21) Appl. No.: 16/313,250

(22) PCT Filed: Sep. 28, 2018

(86) PCT No.: PCT/KR2018/011475
§ 371 (c)(1),
(2) Date: Dec. 26, 2018

(87) PCT Pub. No.: WO2020/036255
PCT Pub. Date: Feb. 20, 2020

(30) Foreign Application Priority Data

Aug. 14, 2018 (KR) ........................ 10-2018-0095151

(51) Int. Cl.
| | |
|---|---|
| *H01L 25/075* | (2006.01) |
| *H01L 33/62* | (2010.01) |
| *G03B 15/05* | (2006.01) |
| *H01L 33/58* | (2010.01) |

(52) U.S. Cl.
CPC .......... *H01L 25/0753* (2013.01); *G03B 15/05* (2013.01); *H01L 33/62* (2013.01); *H01L 33/58* (2013.01); *H01L 2933/0066* (2013.01)

(58) Field of Classification Search
CPC ..... H01L 25/0753; H01L 33/62; H01L 33/58; H01L 2933/0066; G03B 15/05
See application file for complete search history.

(56) References Cited

U.S. PATENT DOCUMENTS

| | | | |
|---|---|---|---|
| 10,490,507 B1* | 11/2019 | Maxey | .................... H05K 1/038 |
| 2003/0052594 A1* | 3/2003 | Matsui | ................ H01L 25/0753 313/495 |
| 2010/0317132 A1* | 12/2010 | Rogers | .................. H01L 33/486 438/27 |

(Continued)

FOREIGN PATENT DOCUMENTS

| | | |
|---|---|---|
| KR | 101120460 | 3/2012 |
| KR | 1020140048182 | 4/2014 |
| KR | 1020160103572 | 9/2016 |

*Primary Examiner* — Victor A Mandala
(74) *Attorney, Agent, or Firm* — IPLA P.A.

(57) ABSTRACT

A collapsible lighting device having circuit wires and LED modules and a method for manufacturing the same wherein the lighting device is collapsible in every direction, thereby being easy to be carried and stored, and makes use of the LED modules, thereby reducing an amount of power consumed. The collapsible lighting device includes: a main sheet formed of fibers made of a soft material collapsible with no directionality and an electrical insulation material for insulating electricity flowing along circuit wires, the fibers being resistant to a temperature greater than 250° C.; LED modules mounted on the main sheet in such a manner as to be electrically connected to the circuit wires; and a front sheet attached to top of the main sheet.

11 Claims, 5 Drawing Sheets

(56) References Cited

U.S. PATENT DOCUMENTS

| | | | |
|---|---|---|---|
| 2011/0133239 A1* | 6/2011 | Lin | H05K 1/189 |
| | | | 257/99 |
| 2013/0292715 A1* | 11/2013 | Lindberg | H01L 33/36 |
| | | | 257/88 |
| 2014/0048824 A1* | 2/2014 | Hsieh | F21K 9/232 |
| | | | 257/88 |
| 2015/0003034 A1* | 1/2015 | Nakamura | H04N 5/2256 |
| | | | 362/3 |
| 2018/0038578 A1* | 2/2018 | Son | F21V 19/0015 |
| 2018/0159002 A1* | 6/2018 | Yamashita | H01L 33/58 |
| 2019/0013275 A1* | 1/2019 | Sunshine | D02G 3/441 |
| 2019/0393389 A1* | 12/2019 | Chen | H01L 33/505 |

* cited by examiner

COLLAPSIBLE LIGHTING DEVICE HAVING CIRCUIT WIRE AND LED MODULE AND METHOD FOR MANUFACTURING THE SAME

BACKGROUND

The present invention relates to a lighting device that is utilized upon photographing in indoors and outdoors and a method for manufacturing the same, and more particularly, to a collapsible lighting device having circuit wires and LED modules and a method for manufacturing the same wherein the lighting device is collapsible in every direction, thereby being easy to be carried and stored, and makes use of the LED modules, thereby reducing an amount of power consumed.

Lighting is widely used upon photographing at a place where light is not sufficiently supplied or in a movie or video field for producing different moods. At this time, the lighting is provided to different kinds and shapes according to its use purpose. For example, the lighting, which is used in the outdoors or studios for taking pictures or videos, makes use of a fluorescent lamp, halogen lamp, discharge lamp, metal halide lamp, and so on, as its light source.

Generally, a widely used lighting device basically includes a support stand and a flat housing disposed on top of the support stand, and a single lamp or a plurality of lamps are located in the flat housing. Further, a light collecting plate may be disposed on the front end of the housing to collect and irradiate the light from the lamps in an open direction of the housing.

However, most of lamps used in general lighting devices consume high power of 200 W to 2 kW, and their life span is just 3,000 to 9,000 hours. During broadcasting and photographing, on the other hand, a quality of production is differently obtained according to the states of the lamps.

Even if the life spans of the lamps for the lighting device is left, the color temperatures of the lamps may be changed after a given period of time, so that exchange cycles of the lamps become substantially shorter than reference life spans thereof, thereby undesirably increasing lamp exchange costs.

In case of the lighting device using the halogen lamp, strong radiant heat as well as light is generated from the lamp, so that an object's skin may be damaged during the broadcasting or photographing and the lighting device may be malfunctioned or broken due to the strong heat.

Like this, the lighting device using the halogen lamp has to have separate air conditioning equipment to solve the above-mentioned problems, thereby making it inconvenient to use. So as to remove such problems, further, there is suggested a lighting device using a triple wave lamp having high power efficiency and low heat generation.

However, the lighting device for broadcasting and photographing requires total luminous flux greater than 20,000 lm (lumen), but the triple wave lamp does not satisfy such total luminous flux.

Moreover, a lighting device using LEDs having a high efficiency has been recently developed. The lighting device using the LEDs has the half of energy consumption of the existing lighting device, and its life span is ten times as long as the existing lighting device's, so that the lighting device using the LEDs is very efficient and economical.

However, the lighting device using the LEDs generally has a shape of a fixed rectangle, and tens of lamps or hundreds of LED modules have to be disposed to maintain total luminous flux to a high level, thereby undesirably having a large volume.

Accordingly, a vehicle like a tower truck in which a loading space is large should be inconveniently used at the time when the lighting device is transferred, and since the lighting device has such fixed outer shape, further, it is not easy to further extend the lighting device. So as to provide a high degree of brightness, a plurality of lighting devices have to be used together.

So as to remove the above-mentioned problems, Korean Patent No. 10-1708550 discloses a flexible lighting panel including a base layer made of a soft flame retarded and waterproof fiber material collapsible with no directionality and having circuit wires on top thereof, a plurality of LEDs mounted on the base layer in such a manner as to be electrically connected to the circuit wires, a black sheet layer laminatedly attached to the entire top of the base layer excepting the plurality of LEDs by means of an adhesive, and a transparent cover layer made of a waterproof synthetic resin material for coveringly sealing the black sheet layer and the plurality of LEDs.

The conventional flexible lighting panel is kept collapsible with no directionality or rolled, but since the plurality of LEDs are fixed to the black sheet layer and the transparent cover layer in a state of being mounted on the base layer, if problems such as a short circuit and the like happen, it is hard to separate the black sheet layer from the base layer. If the black sheet layer is separated from the base layer, further, it is difficult to allow the plurality of LEDs to be stably kept mounted on the base layer.

SUMMARY OF THE INVENTION

Accordingly, the present invention has been made in view of the above-mentioned problems occurring in the prior art, and it is an object of the present invention to provide a collapsible lighting device having circuit wires and LED modules and a method for manufacturing the same wherein the lighting device is collapsible in every direction to provide a small volume, thereby ensuring improvements in storage, delivery and portability, and makes use of the LED modules, thereby reducing an amount of power consumed.

It is another object of the present invention to provide a collapsible lighting device having circuit wires and LED modules and a method for manufacturing the same wherein even if the lighting device is subjected to a reflow treatment at a temperature greater than 250° C. to fix the LED modules to the circuit wires through conductive adhesive materials, no damage thereon occurs.

To accomplish the above-mentioned objects, according to a first aspect of the present invention, there is provided a collapsible lighting device having circuit wires and LED modules, including: a main sheet formed of fibers made of a soft material collapsible with no directionality and an electrical insulation material for insulating electricity flowing along the circuit wires, the fibers being resistant to a temperature greater than 250° C.; the LED modules mounted on the main sheet in such a manner as to be electrically connected to the circuit wires; and a front sheet attached to top of the main sheet.

To accomplish the above-mentioned objects, according to a second aspect of the present invention, there is provided a method for manufacturing a collapsible lighting device having circuit wires and LED modules, the method including: the circuit wire arranging step of arranging the circuit wires on top of a main sheet made of fibers formed of a soft material collapsible with no directionality and an electrical insulation material for insulating electricity flowing along the circuit wires, the fibers being resistant to a temperature greater than 250° C.; the printing step of performing lithography through photomasks to apply conductive adhesive materials to the circuit wires at given intervals; the LED module mounting step of mounting the LED modules on the conductive adhesive materials; the melting step of performing a reflow treatment to allow the main sheet on which the LED modules are mounted to be heated to a maximum temperature of 150 to 250° C. to fix the LED modules to the circuit wires; and the front sheet attaching step of attaching a front sheet to the front surface of the main sheet.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENTS

Hereinafter, an explanation on a collapsible lighting device (hereinafter, referred to as "collapsible lighting device") having circuit wires and LED modules according to the present invention will be in detail given with reference to the attached drawings.

Figure 1:
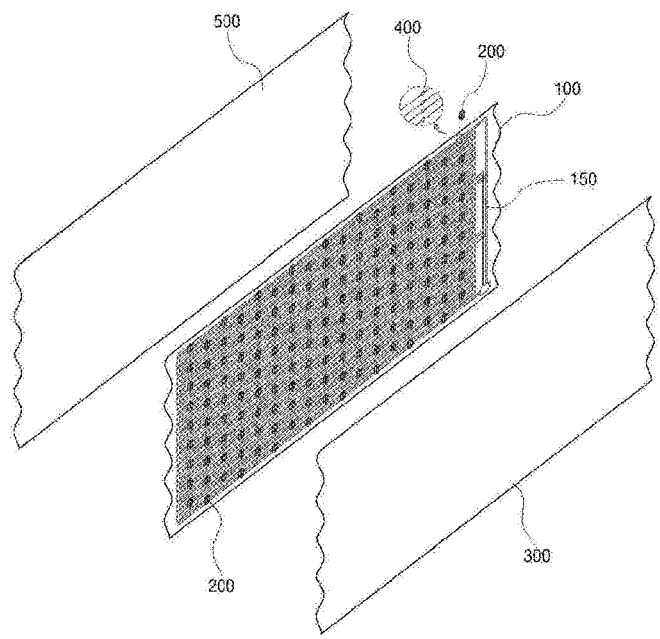
FIG. 1 is an exploded perspective view showing a lighting device according to the present invention.
Figure 2:
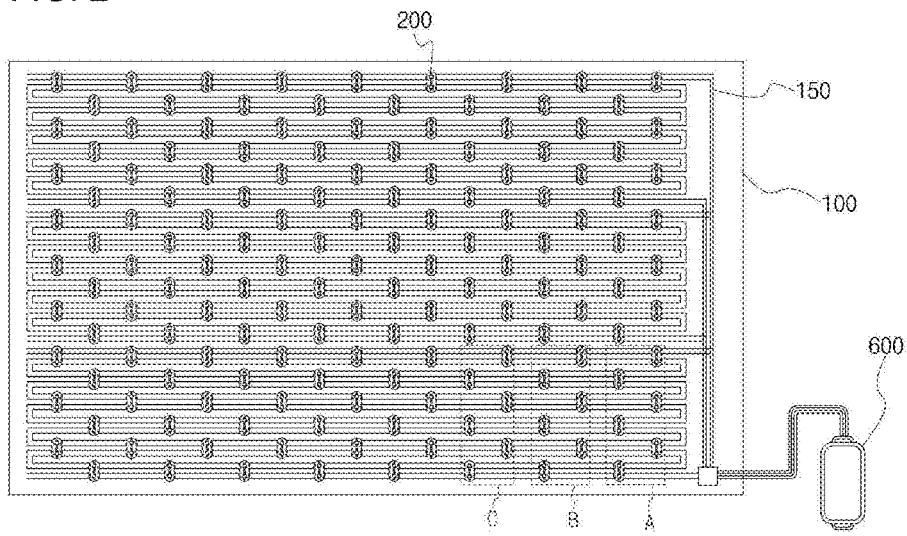
FIG. 2 is a plan view showing circuit wires in the lighting device according to the present invention.

FIG. 1 is an exploded perspective view showing a lighting device according to the present invention, and FIG. 2 is a plan view showing circuit wires in the lighting device according to the present invention.

As shown in FIGS. 1 and 2, the collapsible lighting device according to the present invention includes a main sheet 100 for arranging circuit wires 150 on top thereof, LED modules 200 mounted on the main sheet 100 in such a manner as to be electrically connected to the circuit wires 150, and a front sheet 300 attached to the top of the main sheet 100, and further, the collapsible lighting device selectively includes conductive adhesive materials 400 disposed between the circuit wires 150 and the LED modules 200 to electrically connect the circuit wires 150 and the LED modules 200 and to fix the LED modules 200 to the circuit wires 150.

Now, an explanation on the respective parts of the collapsible lighting device according to the present invention will be in detail given with reference to the attached drawings.

Figure 3:
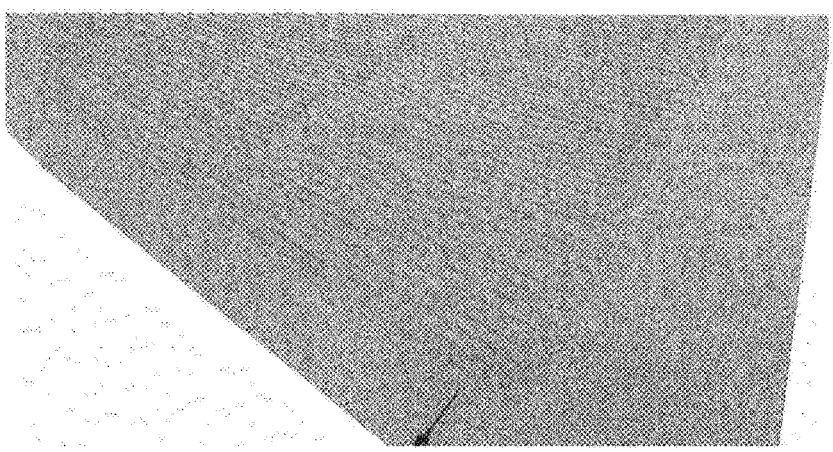
FIG. 3 is a photograph showing a main sheet in the lighting device according to the present invention.

FIG. 3 is a photograph showing the main sheet in the lighting device according to the present invention.

As shown in FIGS. 1 to 3, the collapsible lighting device according to the present invention includes the main sheet 100.

The main sheet 100 is a sheet on which the circuit wires 150 for supplying electricity are arranged, and it is made of synthetic fibers collapsible by an external force.

In this case, the synthetic fibers are formed of a soft material collapsible with no directionality and an electrical insulation material for insulating electricity flowing along the circuit wires 150, and the synthetic fibers are resistant to a temperature greater than 250° C.

In detail, the main sheet 100 is desirably made of aromatic polyamide (aramid) fibers, polyimide fibers, novoloid fibers, carbon fibers, fluorine fibers, or their mixed fibers.

If the main sheet 100 is not made of the fibers resistant to a temperature greater than 250° C., it may be carbonized or shrinked at the time of a reflow treatment wherein the conductive adhesive materials 400 disposed between the circuit wires 150 and the LED modules 200 are heated to a temperature of 150 to 250° C. and then cooled for their curing.

On the other hand, the circuit wires 150 are made of metal thin films or conductive wires, but so as to prevent the circuit wires 150 from being broken upon the reflow treatment, desirably, the circuit wires 150 are made of the conductive wires. At this time, the conductive wires 150 are made of silver wires, alloy wires of copper and nickel, copper wires, stainless steel wires, or their mixed wires.

As shown in FIG. 1, the collapsible lighting device according to the present invention further includes a heat radiating sheet 500.

The heat radiating sheet 500 is attached to the back surface of the main sheet 100 to rapidly emit the heat generated from the LED modules 200, and only if the heat radiating sheet 500 is made of a material for diffusing heat, it does not matter. For example, the heat radiating sheet 500 is made of a woven fabric or synthetic fiber fabric. Otherwise, the heat radiating sheet 500 is made of aluminum coated paper or silver foil coated paper.

The heat radiating sheet 500 also serves as a reflection sheet for reflecting the light reflected on the front sheet 300 in a direction of the front sheet 300 again according to its material like aluminum, copper, silver and so on.

Further, the heat radiating sheet 500 has the same size as the main sheet 100 to cover the back surface of the main sheet 100.

According to the present invention, the heat radiating sheet 500 includes a first sheet made of nylon 210d R/S, silver film coating formed on the front surface of the first sheet facing the main sheet 100, and polycyclohexane-1,4-dimethylene terephthalate (PCT) coating formed on the back surface of the first sheet.

If necessary, the heat radiating sheet 500 may be made of a material like polyester having heat radiating and water proofing functions.

Figure 4:
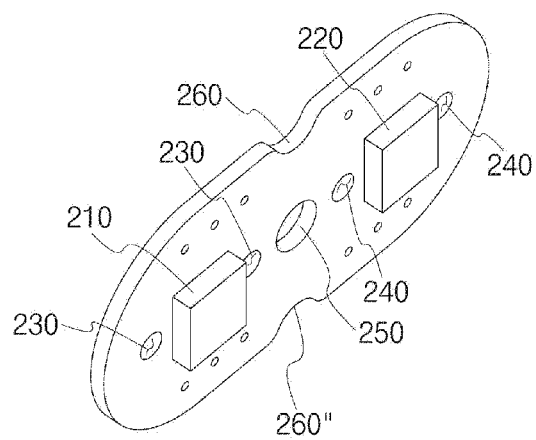
FIG. 4 is a perspective view showing one LED module in the lighting device according to the present invention.
Figure 6:
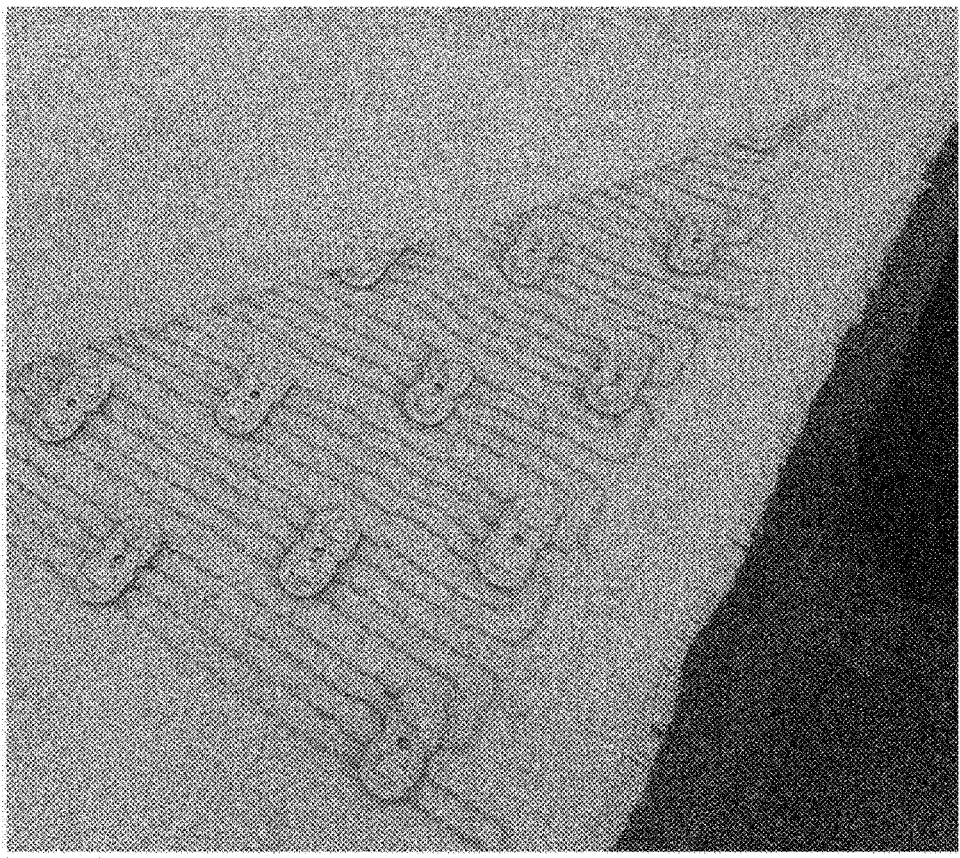
FIG. 6 is a photograph showing the main sheet on which the LED modules are mounted.

FIG. 4 is a perspective view showing one LED module in the lighting device according to the present invention, and FIG. 6 is a photograph showing the main sheet on which the LED modules are mounted.

As shown in FIGS. 1 and 4, the collapsible lighting device according to the present invention includes the LED modules 200.

The LED modules 200 are electrically connected to the circuit wires 150 to generate light with the electric energy supplied from the outside, and to do this, the LED modules 200 are mounted onto the main sheet 100.

Each LED module 200 includes a first LED 210 and a second LED 220 having different color temperatures. For example, an LED having a color temperature of 2500 to 3500 K is used as the first LED 210, and an LED having a color temperature of 4500 to 6500 K is used as the second LED 220.

Further, the first LED 210 and the second LED 220 having different color temperatures from each other are arranged independently of each other on the circuit wires 150, but they are disposed on the single LED module 200. According to the present invention, therefore, no separate maintenance for the first LED 210 and the second LED 220 having different color temperatures is needed, thereby making the maintenance for the parts conveniently carried out, and the manufacturing time of the present invention is shorter than that in the conventional practice wherein the first LED 210 and the second LED 220 are arranged independently of each other on the circuit wires 150.

The single LED module 200 is connected to the four conductive wires to allow electricity to be provided to the first LED 210 and the second LED 220, independently of each other, as shown in FIG. 1, and each of the first LED 210 and the second LED 220 is connected to the two conductive wires.

Moreover, as shown in FIG. 4, the LED module 200 includes first adhesive accommodation holes 230 formed on left and right sides thereof around the first LED 210 to accommodate the conductive adhesive materials 400 therein and second adhesive accommodation holes 240 formed on left and right sides thereof around the second LED 220 to accommodate the conductive adhesive materials 400 therein.

Further, the LED module 200 includes a sewing hole 250 formed between the first LED 210 and the second LED 220. Through the sewing hole 250, a sewing line for binding the LED module 200 to the main sheet 100 is formed. At this time, the sewing line is made of the same fibers as the main sheet 100.

Furthermore, as shown in FIG. 4, the LED module 200 includes a first concave groove 260' and a second concave groove 260'' formed in forward and backward directions around the sewing hole 250. In detail, the first concave groove 260' and the second concave groove 260'' are formed on lines vertical to the line connecting the first adhesive accommodation holes 230 and the second adhesive accommodation holes 240. The first concave groove 260' and the second concave groove 260'' serve to provide spaces in which the sewing line comes into close contact with the LED module 200, thereby allowing the LED module 200 to be stably fixed to the main sheet 100 by means of the sewing line.

Figure 5:
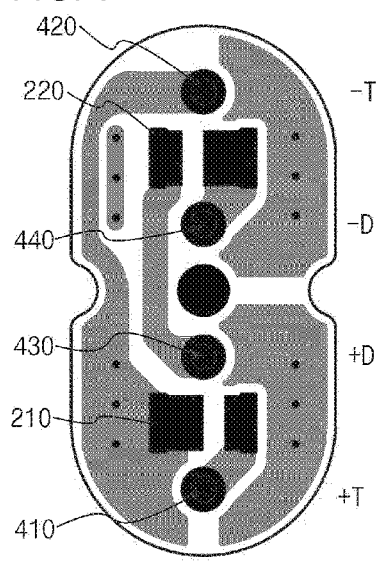
FIG. 5 is a schematic view showing connection relations between detailed parts in the LED module of FIG. 4.

According to the present invention, as shown in FIG. 5, the LED module 200 is configured to have the first conductive adhesive material 410 accommodated in the opposite direction to the second LED 220 with respect to the first LED 210 in such a manner as to be electrically connected to the first LED 210 and the second conductive adhesive material 420 accommodated in the opposite direction to the first LED 210 with respect to the second LED 220 in such a manner as to be electrically connected to the first LED 210.

Further, the LED module 200 is configured to have the third conductive adhesive material 430 accommodated in the same direction as the second LED 220 with respect to the first LED 210 in such a manner as to be electrically connected to the second LED 220 and the fourth conductive adhesive material 440 accommodated in the same direction as the first LED 210 with respect to the second LED 220 in such a manner as to be electrically connected to the second LED 220.

Accordingly, as shown in FIG. 1, the electric energy introduced into the first conductive adhesive material 410 through the first conductive wire is passed sequentially through the first LED 210 and the second conductive adhesive material 420 and is then transferred to the third conductive wire having an internal closed curve structure. Further, electric energy introduced into the third conductive adhesive material 430 through the second conductive wire is passed sequentially through the second LED 220 and the fourth conductive adhesive material 440 and is then transferred to the fourth conductive wire having an external closed curve structure.

Also, the electric energy transferred to the third conductive wire through the first LED module is transferred to the first conductive adhesive material 410 accommodated in the second LED module adjacent to the first LED module in upward and downward directions, and the electric energy transferred to the fourth conductive wire through the first LED module is transferred to the third conductive adhesive material 430 accommodated in the second LED module.

Like this, the second LED module connected to the first LED module through the conductive wire having the closed curve structure, the third LED module connected to the second LED module through the conductive wire having the closed curve structure, the fourth LED module connected to the third LED module through the conductive wire having the closed curve structure, the fifth LED module connected to the fourth LED module through the conductive wire having the closed curve structure, and the sixth LED module connected to the fifth LED module through the conductive wire having the closed curve structure are connected in series with the first LED module (which form a group A).

Moreover, the electric energy transferred to the first conductive wire through the first LED module is transferred to the first conductive adhesive material 410 accommodated in the seventh LED module adjacent to the first LED module in left and right directions, and the electric energy transferred to the second conductive wire through the first LED module is transferred to the third conductive adhesive material 430 accommodated in the seventh LED module.

Like this, the seventh LED module (which forms a group A) connected to the first LED module through the conductive wire having a straight line structure, the eighth LED module (which forms a group A) connected to the seventh LED module through the conductive wire having the straight line structure, the ninth LED module connected to the eighth LED module through the conductive wire having the straight line structure, and the tenth LED module connected to the ninth LED module through the conductive wire having the straight line structure are connected in parallel with the first LED module.

As shown in FIG. 1, the collapsible lighting device according to the present invention further includes the conductive adhesive materials 400.

The conductive adhesive materials 400 are disposed between the circuit wires 150 and the LED modules 200 to electrically connect the circuit wires 150 and the LED modules 200 and to fix the LED modules 200 to the circuit wires 150.

The conductive adhesive materials 400 are made of gold, silver, lead, zinc, copper, tin, or their mixture. If necessary, solder cream may be used as the conductive adhesive materials 400. The solder cream is well known in a soldering process of electronic parts, and therefore, a detailed explanation on the solder cream will be avoided.

In more detail, the conductive adhesive materials 400 are applied to the circuit wires 150 through lithography performed by photomasks on which patterns of the conductive adhesive materials 400 disposed between the circuit wires 150 and the LED modules 200 are formed.

The conductive adhesive materials 400 provide coupling forces between the circuit wires 150 and the LED modules 200 to allow the LED modules 200 to be maintained fixedly to the circuit wires 150, and so as to exchange the given first LED module 200 because of its damage, accordingly, even if the front sheet 300 is separated from the main sheet 100, the plurality of LED modules 200 arranged on the circuit wires 150 are maintained at their initial state, without any escape from the circuit wires 150.

Like this, the movements of the LED modules 200 are limited by means of the front sheet 300 so that the initial positions of the LED modules 200 on the circuit wires 150 can be continuously kept, and further, the LED modules 200 are fixed to the main sheet 100 by means of the conductive adhesive materials 400.

In detail, if the initial positions of the LED modules 200 on the circuit wires 150 are kept through another sheet structure excepting the main sheet 100, the sheet structure has to be separated for the repair of the LED modules 200. In this case, the LED modules 200 are not fixed to the main sheet 100 and easily escape from their initial position by means of an external force. In the same manner as above, if an attaching force between the main sheet 100 and the front sheet 300 is decreased through the collapsing process of the lighting device to cause a given area of the front sheet 300 to be separated from the main sheet 100, the LED modules 200 arranged on the given area are also separated from the main sheet 100.

Figure 7:
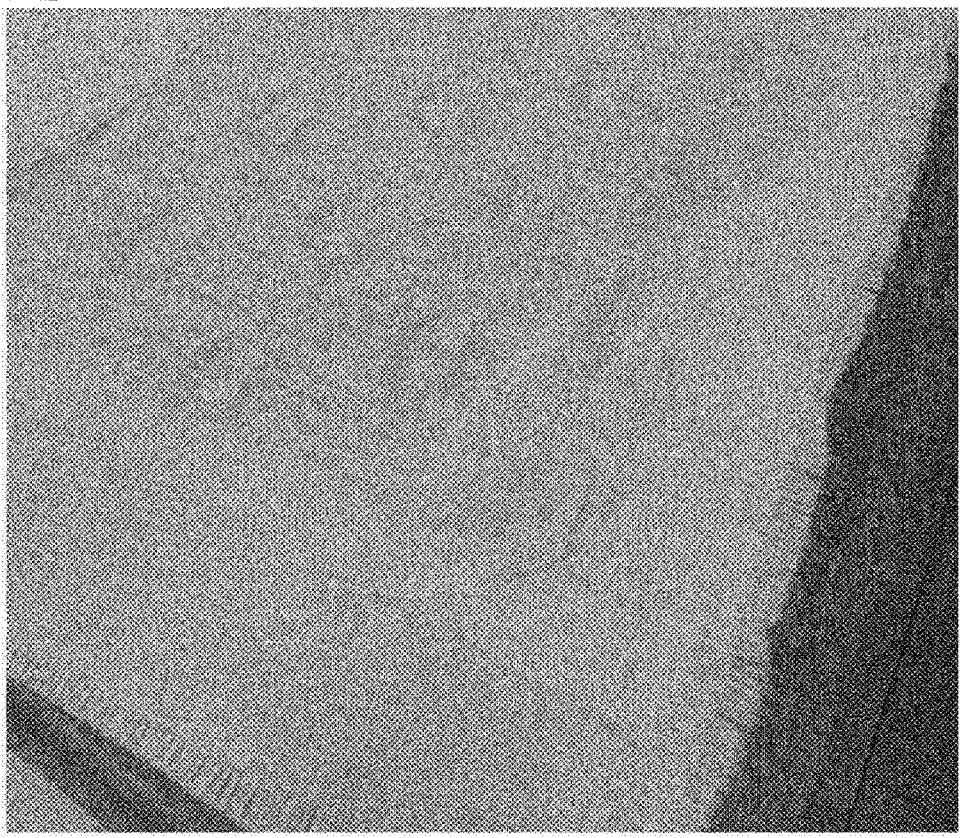
FIG. 7 is a photograph showing the lighting device according to the present invention.

FIG. 7 is a photograph showing the lighting device according to the present invention.

As shown in FIGS. 1 and 7, the collapsible lighting device according to the present invention includes the front sheet 300.

The front sheet 300 is attached to the front surface of the main sheet 100 to protect the LED modules 200 mounted on the main sheet 100 and the circuit wires 150 arranged on the main sheet 100 from the outside, and it is formed of a sheet capable of transmitting the light emitted from the LED modules 200 therethrough.

In detail, the front sheet 300 is made of synthetic fibers such as polyvinyl chloride PVC, polyethylene terephthalate PET, polyethylene 2,6-naphthalate PEN, polybutylene terephthalate PBT, polypropylene PP, polyethylene PE, high density polyethylene HDPE, low density polyethylene LDPE, or linear low density polyethylene LLDPE, so that it is collapsible together with the main sheet 100 by means of the external force.

The front sheet 300 restricts the movements of the circuit wires 150 and the LED modules 200, and even if an external impact is applied, the front sheet 300 prevents a short circuit from occurring due to the movements of the circuit wires 150.

According to the present invention, if necessary, the front sheet 300 is desirably formed of a diffusion sheet for gently diffusing the light emitted from the LED modules 200 to irradiate the light onto an object.

Further, the front sheet 300 has the same size as the main sheet 100 to cover the front surface of the main sheet 100.

According to a preferred embodiment of the present invention, the front sheet 300 includes a second sheet made of nylon 40d R/S and polished and waterproof layers formed on both surfaces of the second sheet.

According to another embodiment of the present invention, the front sheet 300 includes a second sheet made of poly 185 and polyurethane coated layers formed on both surfaces of the second sheet.

According to yet another embodiment of the present invention, the front sheet 300 includes a second sheet made of poly fila 185 or double ribs and polyurethane coated layers formed on both surfaces of the second sheet.

On the other hand, the front sheet 300 includes locking loops disposed along the edges thereof to insert a fixing frame (not shown). The locking loops are disposed on the corners of the front sheet 300, and otherwise, they are disposed along the edges of the front sheet 300 to insert the fixing frame thereinto.

If a large-sized light emitting area is needed according to the use place of the lighting device of the present invention, detachable means (not shown) may be disposed on the front edges of the front sheet 300, the back edges of the main sheet 100, or both of them so as to attach the lighting device to another lighting device. In this case, Velcro tapes are used as the detachable means.

The collapsible lighting device according to the present invention further includes a fixing sheet (not shown).

The fixing sheet is disposed between the main sheet 100 and the front sheet 300 in such a manner as to be attached to the top of the main sheet 100 by means of attaching means like an adhesive.

Further, the fixing sheet has LED module insertion holes formed at the corresponding positions to the LED modules 200 to fittedly insert the LED modules 200 thereinto, and even if the main sheet 100 is collapsed, the formation of the LED module insertion holes suppresses the movements of the LED modules 200 mounted on the main sheet 100, thereby preventing the LED modules 200 from being separated from the main sheet 100.

Moreover, the fixing sheet has a thickness corresponding to the heights of the LED modules 200 mounted on the main sheet 100, thereby preventing the front sheet 300 from getting loose due to the heights of the LED modules 200.

The fixing sheet has the same size as the main sheet 100 to cover the front surface of the main sheet 100.

Like this, the fixing sheet restricts the movements of the circuit wires 150 and the LED modules 200, and even if the external impact is applied, accordingly, the fixing sheet prevents a short circuit from occurring due to the movements of the circuit wires 150 and also covers the circuit wires 150 to prevent the circuit wires 150 from being exposed visually and recognized to the outside.

According to the present invention, if necessary, the fixing sheet is desirably made of a material having a heat radiating function of rapidly diffusing the light emitted from the LED modules 200.

The collapsible lighting device according to the present invention further includes power supply means.

The power supply means provides the power supplied from the outside to the circuit wires 150 and is disposed on the front surface of the front sheet 300 or the back surface of the main sheet 100 in such a manner as to be electrically connected to the circuit wires 150.

The power supply means has a plug connected to a battery supplying the power in such a manner as to be inserted into a socket. At this time, the LED modules 200 can be turned on and off through the connection and separation between the plug and the socket.

If necessary, the power supply means further includes an on/off button (not shown) for cutting off the power supplied from the outside, and further, the collapsible lighting device according to the present invention further includes a dimming device 600 for adjusting light quantity and color temperatures of the LED modules 200. At this time, a DMX (digital multiplex) lighting controller is used as the dimming device 600.

The dimming device 600 serves to differently adjust the brightness of the first LED 210 and the second LED 220 of each LED module 200, thereby expressing various color temperatures. For example, the dimming device 600 allows the brightness of the first LED 210 to become 80%, while allowing the brightness of the second LED 220 to become 20%, according to the signals received from the outside, and otherwise, the dimming device 600 allows the brightness of the first LED 210 to become 20%, while allowing the brightness of the second LED 220 to become 80%.

The collapsible lighting device according to the present invention further includes the fixing frame.

The fixing frame serves to maintain the flattedly spread states of the main sheet 100 and the front sheet 300, and it is inserted into the locking loops disposed on the corners or along the edges of the front sheet 300.

The fixing frame may be disposed only on the front sheet 300, but it may include a support stand adapted to locate the lighting device of the present invention at a position spaced apart from the ground. The shape of the support stand may be freely changed according to the use place of the lighting device, without any specific limitation.

Figure 8:
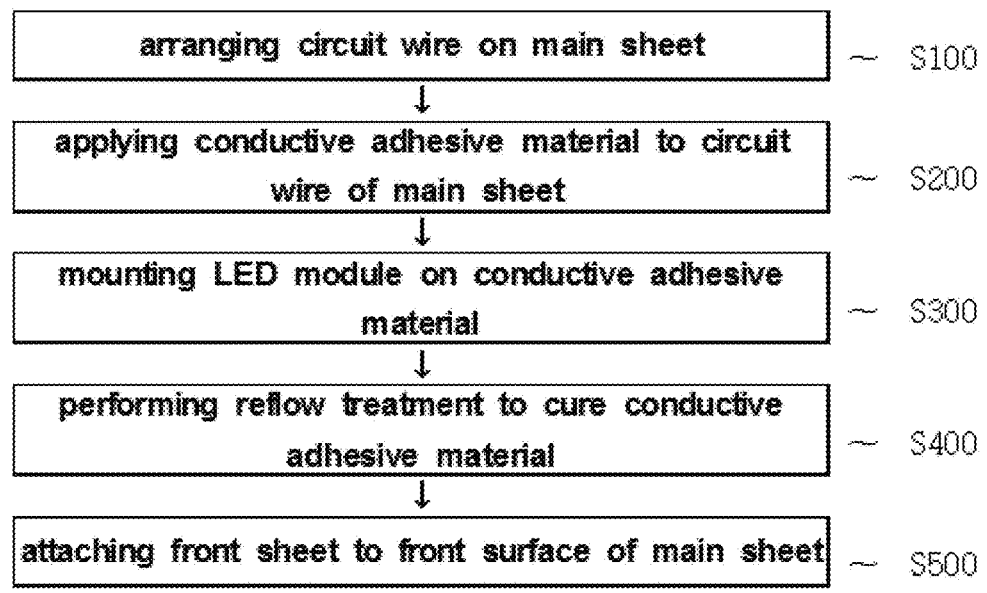
FIG. 8 is a flowchart showing a method for manufacturing the lighting device according to the present invention.

FIG. 8 is a flowchart showing a method for manufacturing the lighting device according to the present invention.

As shown in FIG. 8, a method for manufacturing the collapsible lighting device according to the present invention includes: the circuit wire arranging step of arranging the circuit wires 150 on the top of the main sheet 100 at step 100; the printing step of applying the conductive adhesive materials 400 to the circuit wires 150 of the main sheet 100 at given intervals at step S200; the LED module mounting step of mounting the LED modules 200 on the conductive adhesive materials (at step S300); the melting step of performing the reflow treatment through which the patterns of the conductive adhesive materials are cured at step S400; and the front sheet attaching step of attaching the front sheet 300 to the front surface of the main sheet 100 at step S500.

At the circuit wire arranging step S100, the circuit wires 150 are arranged on the top of the main sheet 100 formed of fibers made of a soft material collapsible with no directionality and an electrical insulation material for insulating electricity flowing along the circuit wires 150, the fibers being resistant to a temperature greater than 250° C., as shown in FIG. 3. At this time, the circuit wires 150 are formed of conductive wires, and they are arranged on the main sheet 100 with patterns in advance set through a computer embroidery sewing machine.

At the printing step S200, lithography is performed through photomasks to apply the conductive adhesive materials 400 to the circuit wires 150 at given intervals. At the printing step of S200, in more detail, the photomasks on which the patterns of the conductive adhesive materials 400 are disposed are located on top of the main sheet 100 on which the circuit wires 150 are arranged, and the lithography is performed by the photomasks to print the patterns of the conductive adhesive materials 400 on the circuit wires 150.

At the LED module mounting step S300, the LED modules 200 are mounted on the circuit wires 150 arranged on the top of the main sheet 100 through a surface mounter component, as shown in FIG. 6.

At the melting step S400, the main sheet 100 on which the LED modules 200 are mounted is subjected to the reflow treatment so that it is heated to a maximum temperature of 150 to 250° C. to allow the LED modules 200 to be fixed to the circuit wires 150. At the melting step S400, in more detail, the main sheet 100 on which the LED modules 200 are mounted is put into a reflow treatment device, heated to a temperature of 150 to 250° C., and then cooled, thereby allowing the conductive adhesive materials 400 to be cured. At this time, the cured conductive adhesive materials 400 serve to fix the LED modules 200 to the main sheet 100 and to supply the electric energy transferred through the circuit wires 150 to the LED modules 200.

According to the present invention, the melting step S400 includes: the first heating step of heating the main sheet 100 on which the LED modules 200 are mounted to gradually increasing temperatures for five to ten minutes until the main sheet 100 reaches the set maximum temperature; the second heating step of heating the main sheet 100 on which the LED modules 200 are mounted to the set maximum temperature for four to six minutes; and the cooling step of cooling the main sheet 100 on which the LED modules 200 are mounted until the main sheet 100 reaches a room temperature.

Like this, heating the main sheet 100 on which the LED modules 200 are mounted through the first heating step and the second heating step at the melting step S400 prevents the circuit wires 150 and the LED modules 200 from being exposed to drastic temperature changes, thereby protecting them from thermal impact (cracks and movements).

At the front sheet attaching step S500, the front sheet 300 is attachedly fixed to the front surface of the main sheet 100 after the melting step S400, as shown in FIG. 7.

Hereinafter, an explanation on detailed embodiments and examples of the present invention will be in detail given. However, the embodiments and examples of the present invention serve to facilitate the general understanding of the scope of the present invention, and therefore, the present invention is not limitedly interpreted only with the embodiments and examples.

EMBODIMENT

Firstly, the circuit wires were arranged on top of the main sheet made of aramid fibers with patterns in advance set through a computer embroidery sewing machine (Husqvarna Viking Ruby Deluxe, svp, China).

Secondly, a mixture of tin, silver and copper as the conductive adhesive materials was applied to the circuit wires of the main sheet through the photomasks on which the patterns of the conductive adhesive materials are formed and a screen printer.

Thirdly, the LED modules were mounted on the conductive adhesive materials applied to the main sheet through a surface mounter (i-Pulse M20, Yamaha, Japan).

Fourthly, the main sheet on which the LED modules were mounted was put into a reflow treatment device, heated to a temperature of 240° C., and then cooled, thereby allowing the conductive adhesive materials to be cured.

Lastly, the front sheet was laminatedly attached to the front surface of the main sheet, thereby completely manufacturing the lighting device according to the present invention.

Comparison Example 1

A lighting device was manufactured in the same manner as the Embodiment of the present invention, but instead of the main sheet made of the aramid fibers, the main sheet made of non-flame retarded cotton fibers was used.

Comparison Example 2

A lighting device was manufactured in the same manner as the Embodiment of the present invention, but instead of the main sheet made of the aramid fibers, the main sheet made of flame retarded cotton fibers was used.

Example 1

The colors and textures of the lighting devices manufactured through the Embodiment of the present invention and the comparison Examples 1 and 2 were compared. At this time, the lighting devices manufactured through the Embodiment of the present invention and the comparison Examples 1 and 2 are shown in FIGS. 9 to 11.

Figure 9:
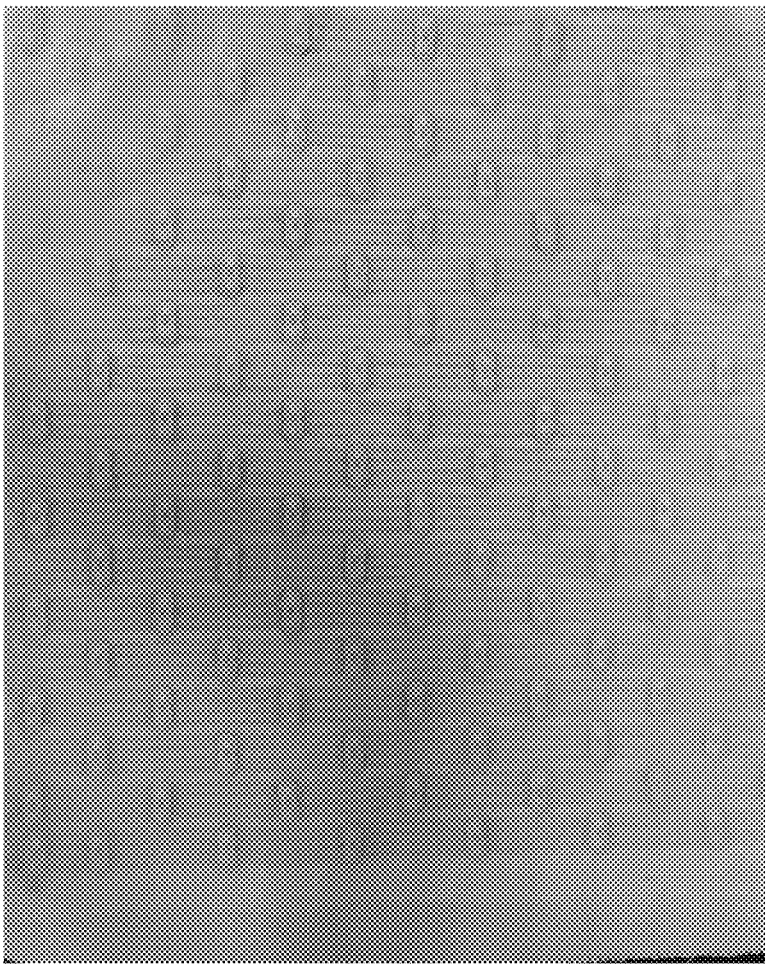
FIG. 9 is a photograph showing the lighting device according to the present invention after a reflow treatment.

As shown in FIG. 9, even if the main sheet made of the aramid fibers was subjected to the reflow treatment at a temperature of 240° C., it was observed that no shrinkage or discoloration occurred on the main sheet.

Figure 10:
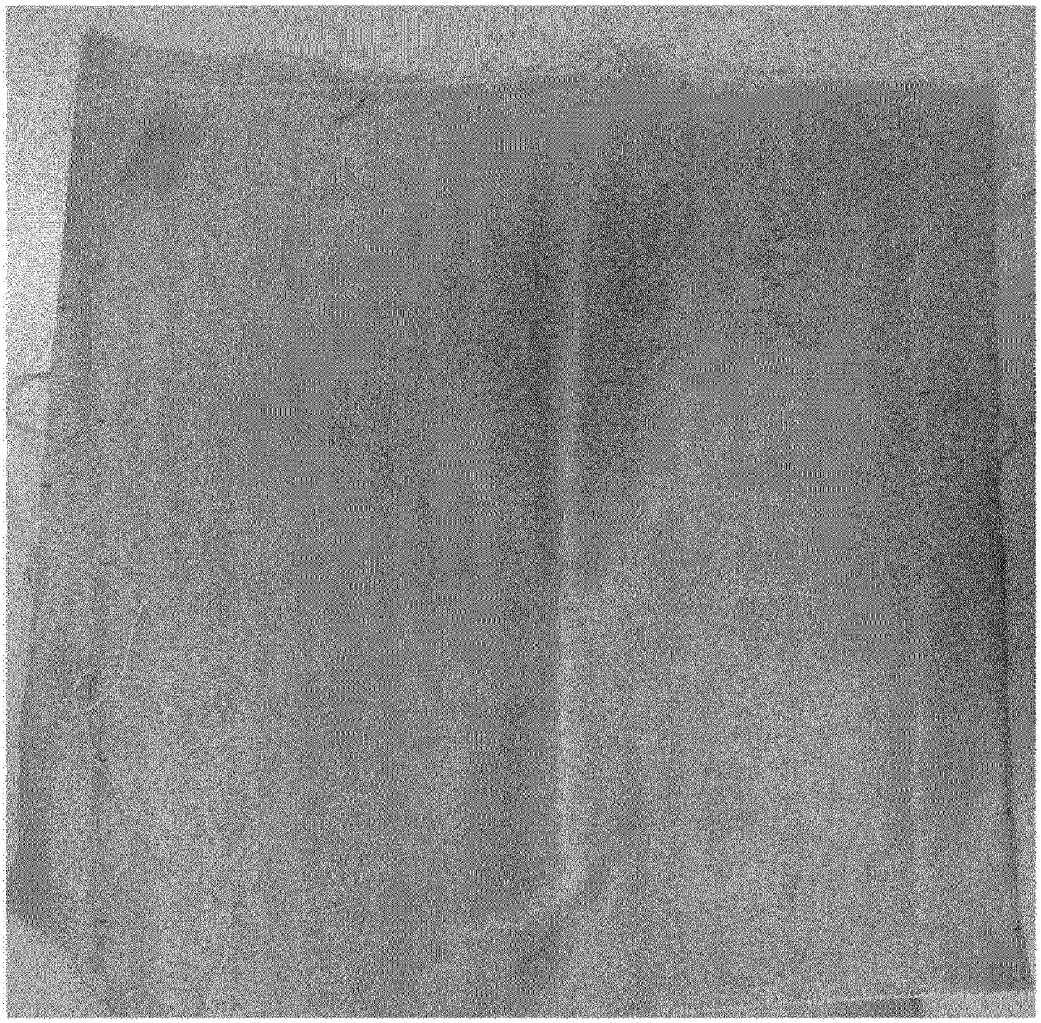
FIG. 10 is a photograph showing conventional heat resistant fibers after a reflow treatment.

As shown in FIG. 10, if the main sheet made of the non-flame retarded cotton fibers was used, it was observed that the main sheet was cured, broken and discolored yellowish in the process of the reflow treatment.

Figure 11:
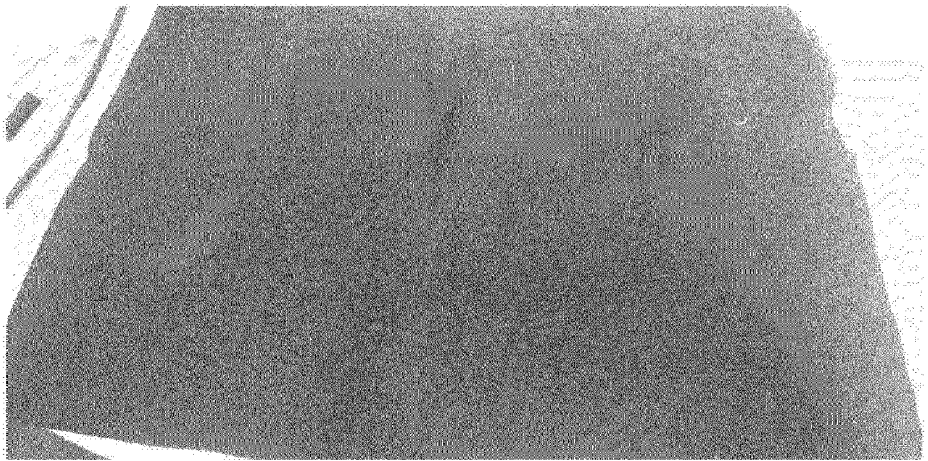
FIG. 11 is a photograph showing conventional flame retarded fibers after a reflow treatment.

As shown in FIG. 11, if the main sheet made of the flame retarded cotton fibers was used, it was observed that the main sheet was cured, broken and carbonized to a black color in the process of the reflow treatment.

Like this, the conventional flexible lighting device with no conductive adhesive materials makes use of the flame retarded fibers as a base layer, but since the base layer is not configured in consideration of the reflow treatment, the base layer may be cured, broken, or discolored. However, the collapsible lighting device according to the present invention does not have any curing or discoloration of the main sheet.

As described above, the collapsible lighting device according to the present invention can be collapsed in every direction, without any limitation in directions, so that the entire volume thereof while being kept in a given place can be smaller than the volume thereof while being used, thereby making the lighting device portable and convenient in delivery and storage.

In addition, the collapsible lighting device according to the present invention can be attached to another lighting device according to the present invention, thereby enabling the light emitting area to be extended.

Further, the collapsible lighting device according to the present invention can be installed on the frame like a support stand, thereby providing lighting at various positions upon taking pictures or videos in the outdoors.

Furthermore, the collapsible lighting device according to the present invention can make use of the LED modules, so that low power is consumed and the brightness of the LED modules is selectively adjusted, thereby obtaining various production within a short period of time through one lighting device upon photographing.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A collapsible lighting device having circuit wires and LED modules, comprising:
   a main sheet formed of fibers made of a soft material collapsible with no directionality and an electrical insulation material for insulating electricity flowing along the circuit wires, the fibers being resistant to a temperature greater than 250° C.;
   the LED modules mounted on the main sheet in such a manner as to be electrically connected to the circuit wires; and
   a front sheet attached to top of the main sheet.

2. The lighting device according to claim 1, further comprising conductive adhesive materials disposed between the circuit wires and the LED modules to electrically connect the circuit wires and the LED modules and to fix the LED modules to the circuit wires.

3. The lighting device according to claim 2, wherein the conductive adhesive materials are made of gold, silver, lead, zinc, copper, tin, or their mixture.

4. The lighting device according to claim 1, wherein the front sheet is a diffusion sheet for diffusing the light emitted from the LED modules to irradiate the light onto an object.

5. The lighting device according to claim 1, wherein the circuit wires are formed of conductive wires.

6. The lighting device according to claim 1, wherein each LED module comprises:
   a first LED and a second LED having different color temperatures;
   first adhesive accommodation holes formed on left and right sides thereof around the first LED to accommodate the conductive adhesive materials therein; and
   second adhesive accommodation holes formed on left and right sides thereof around the second LED to accommodate the conductive adhesive materials therein.

7. The lighting device according to claim 6, wherein each LED module further comprises:
   a sewing hole formed between the first LED and the second LED; and
   a sewing line for binding the LED module to the main sheet through the sewing hole.

8. The lighting device according to claim 1, wherein the main sheet is made of aromatic polyamide (aramid) fibers, polyimide fibers, novoloid fibers, carbon fibers, fluorine fibers, or their mixed fibers.

9. The lighting device according to claim 1, further comprising a fixing sheet disposed between the main sheet and the front sheet and having LED module insertion holes formed at the corresponding positions to the LED modules to fittedly insert the LED modules thereinto.

10. A method for manufacturing a collapsible lighting device having circuit wires and LED modules, the method comprising:
    the circuit wire arranging step of arranging the circuit wires on top of a main sheet formed of fibers made of a soft material collapsible with no directionality and an electrical insulation material for insulating electricity flowing along the circuit wires, the fibers being resistant to a temperature greater than 250° C.;

the printing step of performing lithography through photomasks to apply conductive adhesive materials to the circuit wires at given intervals;

the LED module mounting step of mounting the LED modules on the conductive adhesive materials;

the melting step of performing a reflow treatment to allow the main sheet on which the LED modules are mounted to be heated to a maximum temperature of 150 to 250° C. to fix the LED modules to the circuit wires; and the front sheet attaching step of attaching a front sheet to the front surface of the main sheet.

11. The method according to claim 10, wherein the melting step comprises:

the first heating step of heating the main sheet on which the LED modules are mounted to gradually increasing temperatures for five to ten minutes until the main sheet reaches the set maximum temperature;

the second heating step of heating the main sheet on which the LED modules are mounted to the set maximum temperature for four to six minutes; and the cooling step of cooling the main sheet on which the LED modules are mounted until the main sheet reaches a room temperature.

\* \* \* \* \*